US009583172B1

United States Patent
Yun et al.

(10) Patent No.: US 9,583,172 B1
(45) Date of Patent: Feb. 28, 2017

(54) SELF-REFRESH CONTROL DEVICE

(71) Applicant: SK hynix Inc., Icheon-si Gyeonggi-do (KR)

(72) Inventors: Tae Sik Yun, Seoul (KR); Dong Beom Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/059,524

(22) Filed: Mar. 3, 2016

(30) Foreign Application Priority Data

Oct. 28, 2015 (KR) .................. 10-2015-0150417

(51) Int. Cl.
*G11C 11/406* (2006.01)
*G11C 11/4076* (2006.01)

(52) U.S. Cl.
CPC .... *G11C 11/40615* (2013.01); *G11C 11/4076* (2013.01)

(58) Field of Classification Search
CPC .............................................. G11C 11/40615
USPC ........................................................ 365/222
See application file for complete search history.

(56) References Cited

U.S. PATENT DOCUMENTS 6,834,021 B2   12/2004   Mori et al.
2013/0031305 A1*  1/2013   Fujisawa ........... G11C 11/40611
                                                                 711/106

FOREIGN PATENT DOCUMENTS

KR            100794998 B1      1/2008

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A self-refresh control device may be provided. The self-refresh control device may include a refresh signal output circuit configured to generate self-refresh signals with an oscillator and provide a refresh signal. The self-refresh control device may begin a self-refresh mode in response to a clock enable signal and a self-refresh signal within a self-refresh entry period, and may prevent performance of a new self-refresh operation by delaying an additional self-refresh signal until after the self-refresh entry period has ended.

20 Claims, 6 Drawing Sheets

SELF-REFRESH CONTROL DEVICE

CROSS-REFERENCE TO RELATED APPLICATION

This application claims priority based upon Korean patent application No. 10-2015-0150417, filed on Oct. 28, 2015, the disclosure of which is hereby incorporated in its entirety by reference herein.

BACKGROUND

1. Technical Field

Embodiments of the present disclosure generally relate to a self-refresh control device, and more particularly, to a technology for reducing a self-refresh current.

2. Related Art

It may be desirable to use high-capacity dynamic random access memories (DRAMs) in mobile electronic appliances. The mobile electronic appliances may include smartphones or the like. Generally, data stored in memory cells of a semiconductor memory device such as DRAM may be changed by a leakage current. Therefore, a refresh operation for periodically recharging data stored in the memory cells is needed.

A memory cell of a dynamic semiconductor memory, such as a DRAM, stores data in a capacitive element. Due to leakage of charges from the capacitive element, the memory cell must be periodically refreshed. The refresh process performs the read operation for restoring a level of charges stored in the memory cell to an original state.

Specifically, a semiconductor memory device, such as Double Data Rate Synchronous DRAM (DDR SDRAM), includes a plurality of memory banks for storing data therein. Each memory bank may include tens of millions of memory cells therein. Each memory cell includes a cell capacitor and a cell transistor. The semiconductor memory device may charge or discharge the cell capacitor to store data therein.

The amount of charges stored in the cell capacitor must be, ideally, constant in so far as an additional control signal is not used. However, the amount of charges stored in the cell capacitor is unavoidably changed due to a difference in voltage between the cell capacitor and the peripheral circuit.

In other words, charges may be leaked outside under the condition that the cell capacitor is charged with electricity, or charges may be received under the condition that the cell capacitor is discharged. Changing the amount of charges stored in the cell capacitor may indicate that data stored in the cell capacitor is changed, resulting in loss of the stored data. The semiconductor memory device may perform the refresh operation to prevent the stored data from being lost.

Different types of refresh methods have been developed. Generally, the auto refresh method uses a refresh timer located outside of a memory chip, such that the memory chip can perform the refresh operation in response to a periodic refresh command from a controller.

The self refresh method uses a refresh timer located inside the memory chip, such that all the memory chips are configured to request a refresh start command from the controller.

SUMMARY

Various embodiments of the present disclosure may be directed to providing a self-refresh control device that substantially obviates one or more problems due to limitations and disadvantages of the related art.

The embodiments of the present disclosure may relate to a self-refresh control device configured not to perform the self-refresh operation during a specific pulse period when entering a self-refresh mode, resulting in reduction of a self-refresh current.

In accordance with an embodiment of the present disclosure, a self-refresh control device may be provided. The self-refresh control device may include an enable signal generation circuit configured to latch a clock enable signal for a predetermined time to output an oscillation enable signal. The self-refresh control device may include an end signal generation circuit configured to select any one of the oscillation enable signal and a self-refresh command signal to output the selected signal as an oscillation end signal. The self-refresh control device may include a refresh signal output circuit configured to generate a self-refresh signal in response to the oscillation end signal, and output a refresh signal by combining the oscillation end signal and the self-refresh signal.

In accordance with an embodiment of the present disclosure, a self-refresh control device may be provided. The self-refresh control device may include a refresh signal output circuit configured to generate self-refresh signals with an oscillator and provide a refresh signal. The self-refresh control device may begin a self-refresh mode in response to a clock enable signal and a self-refresh signal within a self-refresh entry period, and may prevent performance of a new self-refresh operation by delaying an additional self-refresh signal until after the self-refresh entry period has ended.

In accordance with an embodiment of the present disclosure, a self-refresh control device may be provided. The self-refresh control device may include a refresh signal output circuit configured to generate self-refresh signals with an oscillator and provide a refresh signal. The self-refresh control device may begin a self-refresh mode in response to a clock enable signal and a self-refresh signal within a self-refresh entry period, and may only activate the refresh signal once during the self-refresh entry period.

Wherein the number of the plurality of inverters is denoted by an odd number such that the odd inverters are coupled in series to each other.

Wherein the second combination circuit includes: a second logic gate configured to perform a NAND operation between the delay signal and the oscillation end signal; and a second inverter configured to output the refresh signal by inverting an output signal of the second logic gate.

Wherein a pulse signal period of the test signal is changed according to a temperature.

DETAILED DESCRIPTION

Reference will now be made below to embodiments of the present disclosure, examples of which are illustrated in the accompanying drawings. Wherever possible, the same reference numbers are used throughout the drawings to refer to the same or like portions. In the following description of the present disclosure, a description of related known configurations or functions incorporated herein may be omitted for clarity of the subject matter of the present disclosure.

Figure 1:
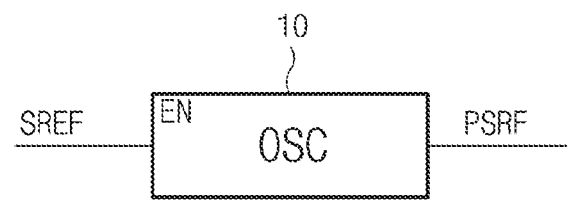
FIGS. 1 and 2 are conceptual diagrams illustrating representations of examples of the operation of a self-refresh control device.
Figure 2:
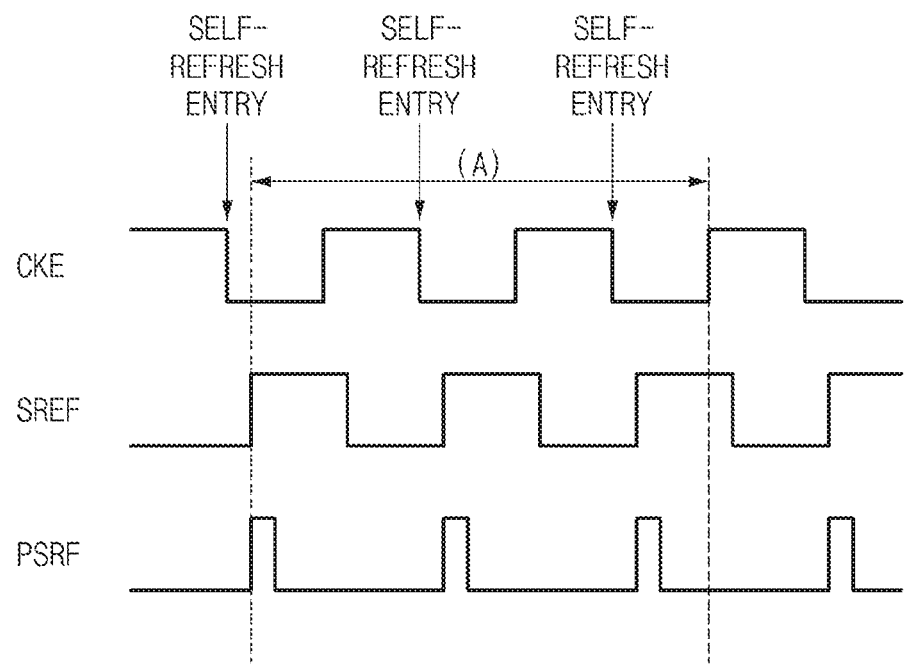

FIGS. 1 and 2 are conceptual diagrams illustrating representations of examples of the operation of a self-refresh control device.

Referring to FIG. 1, the self-refresh control device may include an oscillation (OSC) unit 10. The oscillator 10 may oscillate a self-refresh command signal (SREF) to output a self-refresh signal (PSRF).

Referring to FIG. 2, the self-refresh control device may be synchronized with the falling edge of a clock enable signal (CKE) and then enter a self-refresh mode. During a self-refresh mode section (A), the self-refresh control device is synchronized with the rising edge of the self-refresh command signal (SREF) such that pulses of the self-refresh signal (PSRF) can be activated.

For example, assuming that the self-refresh operation is successively performed at the falling edge of the clock enable signal (CKE), the pulses of the self-refresh signal (PSRF) may be activated in response to the self-refresh command signal (SREF). The semiconductor device may perform the self-refresh operation when the self-refresh signal (PSRF) is activated.

Under the condition that the self-refresh command signal (SREF) is at a high level, the oscillator 10 may generate the self-refresh signal (PSRF) according to specification of the semiconductor device at intervals of a specific period. However, the oscillator 10 starts operation whenever repeatedly entering the self-refresh mode within a predetermined time section (A) (e.g., 7.8 μs). As described above, assuming that the self-refresh operation is repeatedly performed within the predetermined time section (A), unnecessary current consumption may occur.

Figure 3:
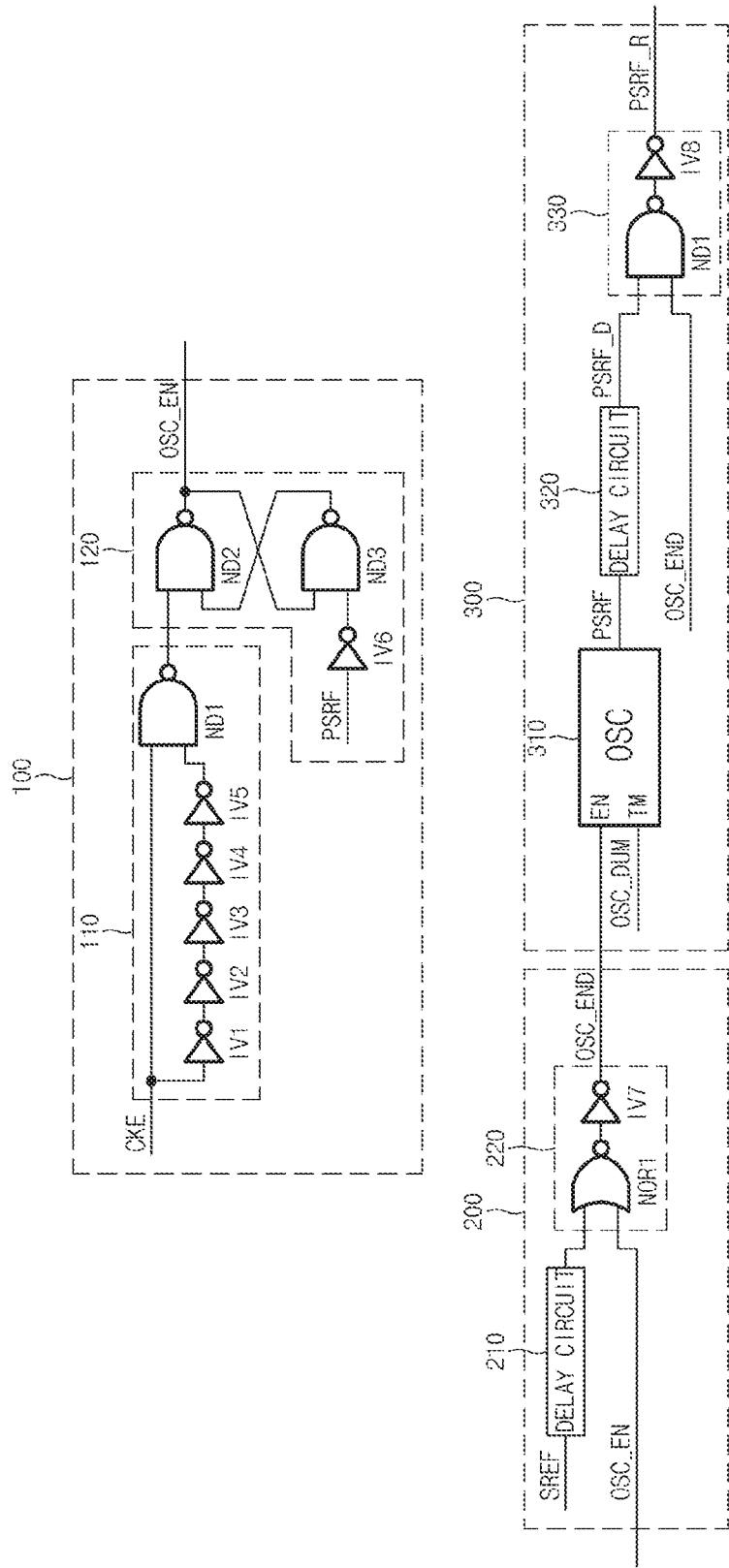
FIG. 3 is a circuit diagram illustrating a representation of an example of a self-refresh control device according to an embodiment of the present disclosure.

FIG. 3 is a circuit diagram illustrating a representation of an example of a self-refresh control device according to an embodiment of the present disclosure.

Referring to FIG. 3, the self-refresh control device according to an embodiment may include an enable signal generation circuit 100, an end signal generation circuit 200, and a refresh signal output circuit 300.

In this case, the enable signal generation circuit 100 may latch a high-level pulse of the clock enable signal (CKE) during a predetermined time, and thus output an oscillation enable signal (OSC_EN). The clock enable signal (CKE) may indicate whether a clock signal for synchronizing the driving of the semiconductor memory device is valid or not.

If the self-refresh signal (PSRF) is activated to a high level, the enable signal generation circuit 100 may deactivate the oscillation enable signal (OSC_EN). The enable signal generation circuit 100 may include a pulse generator 110 and a latch circuit 120.

The pulse generator 110 may delay the clock enable signal (CKE) and then generate a pulse signal. For this purpose, the pulse generator 110 may include a plurality of inverters (IV1~IV5) and a NAND gate (ND1). The inverters (IV1~IV5) coupled in series to each other may delay the clock enable signal (CKE) and then output the delayed clock enable signal (CKE). In this case, the number of the inverters (IV1~IV5) is denoted by an odd number, the odd inverters (IV1~IV5) are coupled in series to each other such that the clock enable signal (CKE) is inverted and delayed. The NAND gate (ND1) may perform the NAND operation between the clock enable signal (CKE) and the output signal of the inverter (IV5).

The latch circuit 120 may latch the output signal of the pulse generator 110 for a predetermined time before the self-refresh signal (PSRF) is activated, and then output the oscillation enable signal (OSC_EN). For example, the latch circuit 120 may be implemented as an SR (Set, Reset) latch structure. The latch circuit 120 may receive the output signal of the pulse generator 110 as a set signal, and may receive the self-refresh signal (PSRF) as a reset signal.

The latch circuit 120 may include an inverter IV6 and NAND gates (ND2, ND3). The NAND gate (ND2) may perform the NAND operation between the output signal of the NAND gate (ND1) and the output signal of the NAND gate (ND3), and thus output the oscillation enable signal (OSC_EN). The NAND gate (ND3) may perform the NAND operation between the self-refresh signal (PSRF) inverted by the inverter (IV6) and the oscillation enable signal (OSC_EN), and thus output the NAND operation result to the NAND gate (ND2).

The end signal generation circuit 200 may select any one of the oscillation enable signal (OSC_EN) and a delay signal of the self-refresh command signal (SREF), and output the selected signal as an oscillation end signal (OSC_END). In this case, the self-refresh command signal (SREF) may be input at a high level during the self-refresh operation period.

In other words, assuming that at least one of the oscillation enable signal (OSC_EN) and the delay signal of the self-refresh command signal (SREF) is activated, the end signal (OSC_END) is activated and then output.

The end signal generation circuit 200 may include a delay circuit 210 and a combination circuit 220. The delay circuit 210 may delay the self-refresh command signal (SREF) for a predetermined time, and then output the delayed self-refresh command signal (SREF). The combination circuit 220 may perform a logic operation on the delayed self-refresh command signal (SREF). For example, the combination circuit 220 may perform an OR operation between the output signal of the delay circuit 210 and the oscillation enable signal (OSC_EN), and thus output the oscillation end signal (OSC_END).

The combination circuit 220 may include, for example but not limited to, a NOR gate (NOR1) and an inverter IV7. The NOR gate (NOR1) may perform a NOR operation between the output signal of the delay circuit 210 and the oscillation enable signal (OSC_EN). The inverter (IV7) may invert the output signal of the NOR gate (NOR1), and thus output the oscillation end signal (OSC_END).

The refresh signal output circuit 300 may generate the self-refresh signal (PSRF) in response to the oscillation end signal (OSC_END). The refresh signal output circuit 300 may delay the self-refresh signal (PSRF) to generate a refresh signal (PSRF_R). The refresh signal (PSRF_R) may be activated on the condition that the oscillation end signal (OSC_END) is activated.

The refresh signal output circuit 300 may include an oscillator 310, a delay circuit 320, and a combination circuit 330. The oscillator 310 may oscillate the oscillation end signal (OSC_END) and thus output the self-refresh signal (PSRF).

The oscillator 310 may also generate the self-refresh signal (PSRF) in response to a test signal (OSC_DUM) that remains high in level for a specific period during a test mode. In this case, a time section of the pulse signal indicating the test signal (OSC_DUM) may change with temperature.

For example, the oscillator 310 may also be applied to a TCSR (Temperature Compensated Self Refresh) operation in which the output signal of an external temperature sensor is used as an input signal and the self-refresh period is adjusted according to temperature variation. The oscillator 310 may also output the other self-refresh signal (PSRF) in which a period value is changed per state of each temperature.

For example, the refresh operation must be frequently carried out at a high temperature such that the test signal (OSC_DUM) may be input for a short period of time. That is, period reduction of the test signal (OSC_DUM) may indicate that the period of the generated self-refresh signal (PSRF) is gradually reduced, such that the number of refresh execution times increases.

On the other hand, the refresh operation need not be frequently carried out at a low temperature, such that the test signal (OSC_DUM) may be input for a long period of time. That is, period increment of the test signal (OSC_DUM) may indicate that the period of the generated self-refresh signal (PSRF) gradually increases, such that the number of refresh execution times decreases.

The delay circuit 320 may delay the self-refresh signal (PSRF) for a predetermined period of time, and thus output a delay signal (PSRF_D). The combination circuit 30 may perform the AND operation between the delay signal (PSRF_D) and the oscillation end signal (OSC_END), and thus output a refresh signal (PSRF_R) having a predetermined pulse width.

The combination circuit 330 may include logic gates. The combination circuit 330 may include for example a NAND gate (ND1) and an inverter (IV8). The NAND gate (ND1) may perform the NAND operation between the delay signal (PSRF_D) and the oscillation end signal (OSC_END). The inverter IV8 may invert the output signal of the NAND gate (ND1) and thus output the refresh signal (PSRF_R).

If the self-refresh control device according to an embodiment successively enters the self-refresh mode within a predetermined time section, the self-refresh control device is configured not to perform a new self-refresh operation whenever entering the self-refresh mode, such that the amount of current consumed by unnecessary refresh actions can be reduced.

Figure 4:
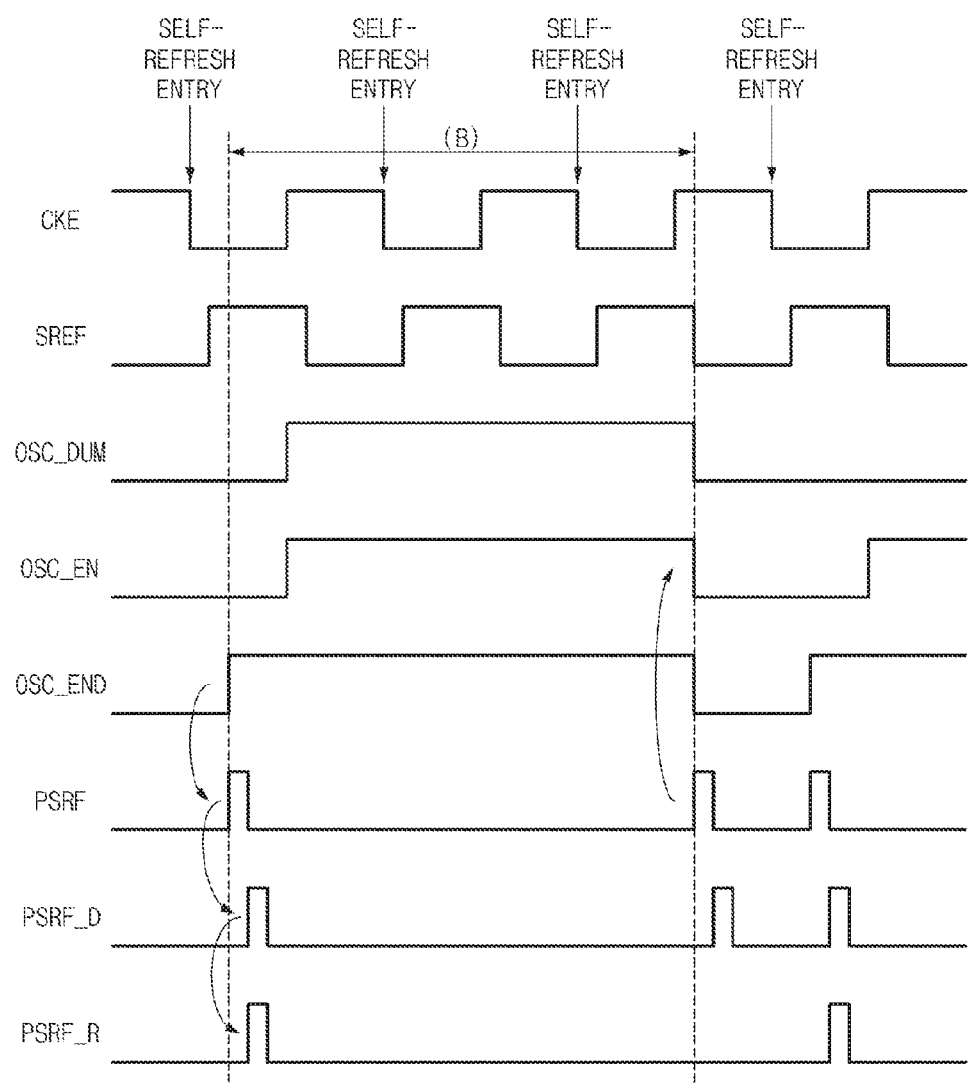
FIG. 4 is a waveform diagram illustrating a representation of an example of the operation of the self-refresh control device illustrated in FIG. 3 according to an embodiment of the present disclosure.

FIG. 4 is a waveform diagram illustrating a representation of an example of the operation of the self-refresh control device illustrated in FIG. 3 according to an embodiment of the present disclosure.

As the demand of users who desire to use mobile products (e.g., a mobile phone, a smartphone, a personal digital assistant (PDA), etc.) is rapidly increasing, many developers and companies persistently make efforts to greatly reduce current consumption of a Dynamic Random Access Memory (DRAM) embedded into such mobile products. Specifically, reduction of the refresh current of DRAMs for use in mobile products becomes highly significant.

Information stored in memory cells of DRAMs from among semiconductor memories may disappear according to lapse of time, differently from Static Random Access Memories (SRAMs) or flash memories. In order to prevent such information from disappearing, information stored in cells is re-written externally at intervals of a predetermined time, and this re-writing operation is referred to as a refresh operation.

During the refresh operation, the word line is activated at least once within a retention time of each cell contained in a memory bank such that data can be sensed and amplified. In this case, the retention time may indicate a specific time in which certain data is written in a cell and the data stored in the cell can be maintained without being refreshed.

The refresh operation may be classified into an auto-refresh operation to be performed in a normal mode and a self-refresh operation to be performed in a power-down mode or the like. The self-refresh operation may be carried out by a self-refresh signal generated by a command decoder configured to receive a command signal or the like as an input. The self-refresh operation according to an embodiment will hereinafter be described with reference to FIG. 4.

If the semiconductor device enters the self-refresh mode, the clock enable signal (CKE) may transition from a high level to a low level. When entering the self-refresh mode, a self-refresh command signal (SREF) is input to the semiconductor device during a predetermined time (B) (e.g., 7.8 μs) in response to the clock enable signal (CKE).

Although the embodiment has disclosed as an example that a section (B) regarding the self-refresh entry period defined in specification of the semiconductor device is set to 7.8 μs for convenience of description and better understanding of the present disclosure, the scope or spirit of the present disclosure is not limited thereto, and the section (B) may also be assigned another time as necessary. If the section (B) regarding the self-refresh entry period is changed, a high-level pulse width of the oscillation end signal (OSC_END) may be adjusted in response to the changed section (B).

Thereafter, the oscillation enable signal (OSC_EN) may be activated to a high level after being synchronized with the rising edge of the clock enable signal (CKE) during the section (B). In this case, the rising edge of the clock enable signal (CKE) may indicate the end time of the self-refresh mode.

Subsequently, the oscillation enable signal (OSC_EN) may be synchronized with the rising edge of the clock enable signal (CKE), be activated, and be maintained at a high-level pulse until the section (B) expires. That is, the oscillation enable signal (OSC_EN) may be latched by the latch circuit 120 before the self-refresh signal (PSRF) is activated.

If the self-refresh signal (PSRF) is activated to a high level, the oscillation enable signal (OSC_EN) is deactivated. That is, the oscillation enable signal (OSC_EN) may be deactivated to a low level by the self-refresh signal (PSRF) generated after lapse of the section (B).

In addition, if the self-refresh command signal (SREF) transitions to a high level and enters the self-refresh mode, the oscillation end signal (OSC_END) may be activated by a delay signal of the self-refresh command signal (SREF).

The oscillation end signal (OSC_END) may remain high in level during the section (B). The oscillation end signal (OSC_END) may transition to a low level when the self-refresh command signal (SREF) and the oscillation enable signal (OSC_EN) are deactivated to a low level after lapse of the section (B).

The oscillator 310 may start operation during the section (B) in which the oscillation end signal (OSC_END) remains activated. The oscillator 310 may generate only one self-refresh signal (PSRF) after being synchronized with the rising edge of the oscillation end signal (OSC_END). That is, even when the oscillator 310 repeatedly enters the self-refresh mode within the section (B), the oscillator 10 may generate only the first self-refresh signal (PSRF) and then remain without change.

Therefore, the number of oscillation times of the oscillator 10 is reduced, such that a current consumed in the oscillator 10 can be reduced as compared to the oscillator 10 illustrated in FIGS. 1 and 2.

Thereafter, the delay circuit 320 may delay the self-refresh signal (PSRF) and output a delay signal (PSRF_D). The refresh signal (PSRF_R) may be activated to a high-level pulse signal only within a specific section in which the delay signal (PSRF_D) and the oscillation end signal (OSC_END) are activated to a high level. The refresh operation of the semiconductor device may be carried out in response to the refresh signal (PSRF_R).

Data stored in the semiconductor device (e.g., DRAM cell) may disappear by a leakage current, such that data stored in the cell is sensed and amplified and the data is then rewritten in the cell, and this operation is referred to as a refresh operation. When an external control signal enters a steady state and remains in the steady state without state change, the refresh operation is periodically performed within the internal part of the semiconductor device, and this refresh operation is referred to as a self-refresh operation.

The counter (not illustrated) may sequentially count the address required for accessing the memory cell in which the refresh operation is performed, whenever the refresh signal (PSRF_R) is generated. Therefore, the self-refresh operation for the memory cell accessed by the address may be sequentially carried out.

Meanwhile, the oscillation enable signal (OSC_EN) may be deactivated to a low level by the self-refresh signal (PSRF) generated after lapse of the section (B). In other words, after lapse of the section (B), assuming that the clock enable signal (CKE) is at a high level and the self-refresh command signal (SREF) and the oscillation enable signal (OSC_EN) are at a low level, this means the presence of the self-refresh end section.

As a result, although the self-refresh signal (PSRF) is activated after lapse of the section (B), the refresh signal (PSRF_R) is not activated. That is, the activation state of the refresh signal (PSRF_R) may be controlled by the AND operation between the self-refresh signal (PSRF) and the oscillation end signal (OSC_END). Accordingly, the self-refresh signal (PSRF) does not pass through the refresh signal output circuit 300 while the oscillation end signal (OSC_END) is at a low level.

Therefore, although the self-refresh signal (PSRF) is activated after lapse of the section (B), the oscillation end signal (OSC_END) is at a low level, such that the refresh signal (PSRF_R) is no longer activated.

As described above, when entering the first self-refresh mode, the oscillation end signal (OSC_END) remains high in level during a predetermined section (B) starting from the activation time of the self-refresh signal (PSRF). The additional self-refresh signal (PSRF) is not generated any more during the section (B).

That is, the self-refresh signal (PSRF) may generate a pulse at intervals of a self-refresh period. However, since the oscillator 310 starts operation by the oscillation end signal (OSC_END), no additional pulses are generated after the self-refresh signal (PSRF) is initially activated.

When the self-refresh control device enters the self-refresh mode, the refresh signal (PSRF_R) is activated only once during the section (B), such that the refresh current can be greatly reduced even when the self-refresh command signal (SREF) is repeatedly input.

Figure 5:
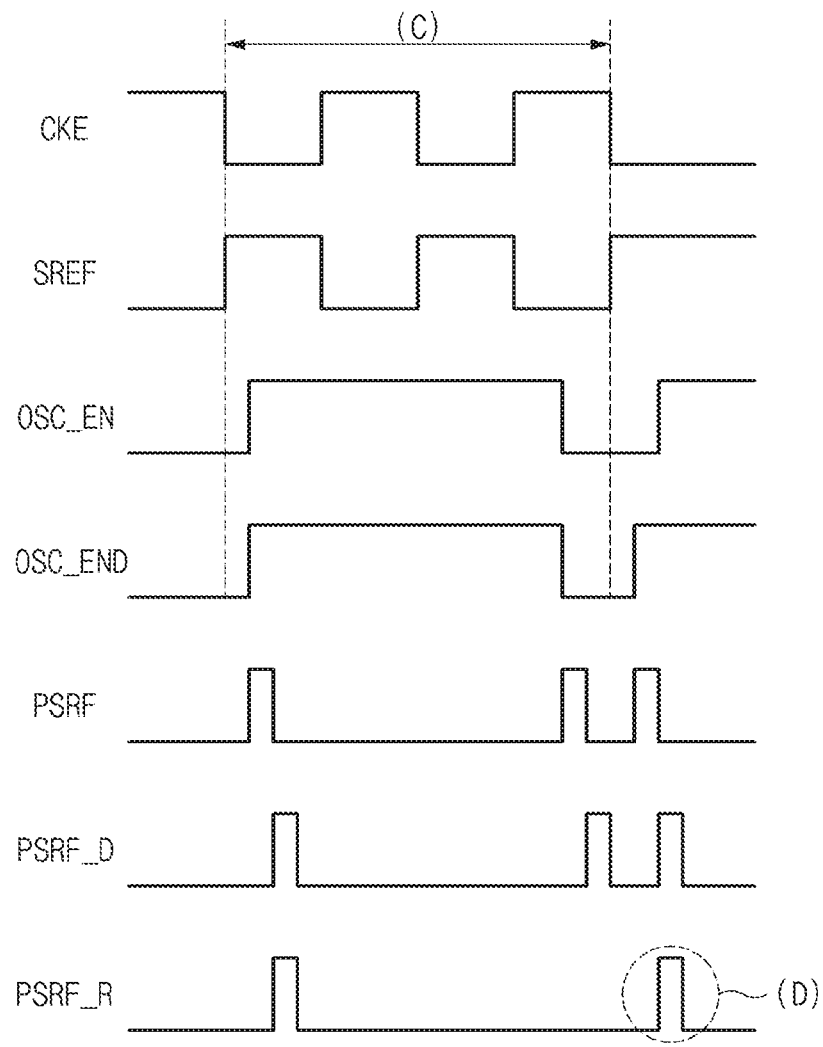
FIG. 5 is a waveform diagram illustrating a representation of an example of the operation of the self-refresh control device illustrated in FIG. 3 according to an embodiment of the present disclosure.

FIG. 5 is a waveform diagram illustrating a representation of an example of the operation of the self-refresh control device illustrated in FIG. 3 according to an embodiment of the present disclosure.

Referring to FIG. 5, when the self-refresh control device enters the self-refresh mode, the self-refresh command signal (SREF) is input during a predetermined specific section (C) (e.g., 7.8 μs) in response to the clock enable signal (CKE).

Although the embodiment has exemplarily disclosed that the section (C) regarding the self-refresh entry section defined in the specification of the semiconductor device is set to 7.8 μs for convenience of description, the scope or spirit of the present disclosure is not limited thereto, and the section (C) may also be assigned another time.

If the section (C) regarding the self-refresh entry period is changed, a high-level pulse width of the oscillation end signal (OSC_END) may be adjusted in response to the changed section (C).

The embodiment of FIG. 5 illustrates that the oscillation enable signal (OSC_EN) has a high-pulse section smaller in size than the predetermined section (C). In this case, a pulse indicating the self-refresh signal (PSRF) may be generated twice within the section (C), and a pulse indicating the delay signal (PSRF_D) may be generated twice within the section (C).

However, since the oscillation end signal (OSC_END) is at a low level, the refresh signal (PSRF_R) is activated once within the section (C), such that the refresh current can be reduced even when the self-refresh command signal (SREF) is input several times.

Subsequently, assuming that the oscillation end signal (OSC_END) is re-activated to a high level after lapse of the section (C), the refresh signal (PSRF_R) is generated as illustrated in the pulse (D), such that the refresh operation may be performed again.

As is apparent from the above description, the self-refresh control device according to the embodiments does not perform the self-refresh operation during a specific pulse period when entering a self-refresh mode, resulting in reduction of a self-refresh current.

Figure 6:
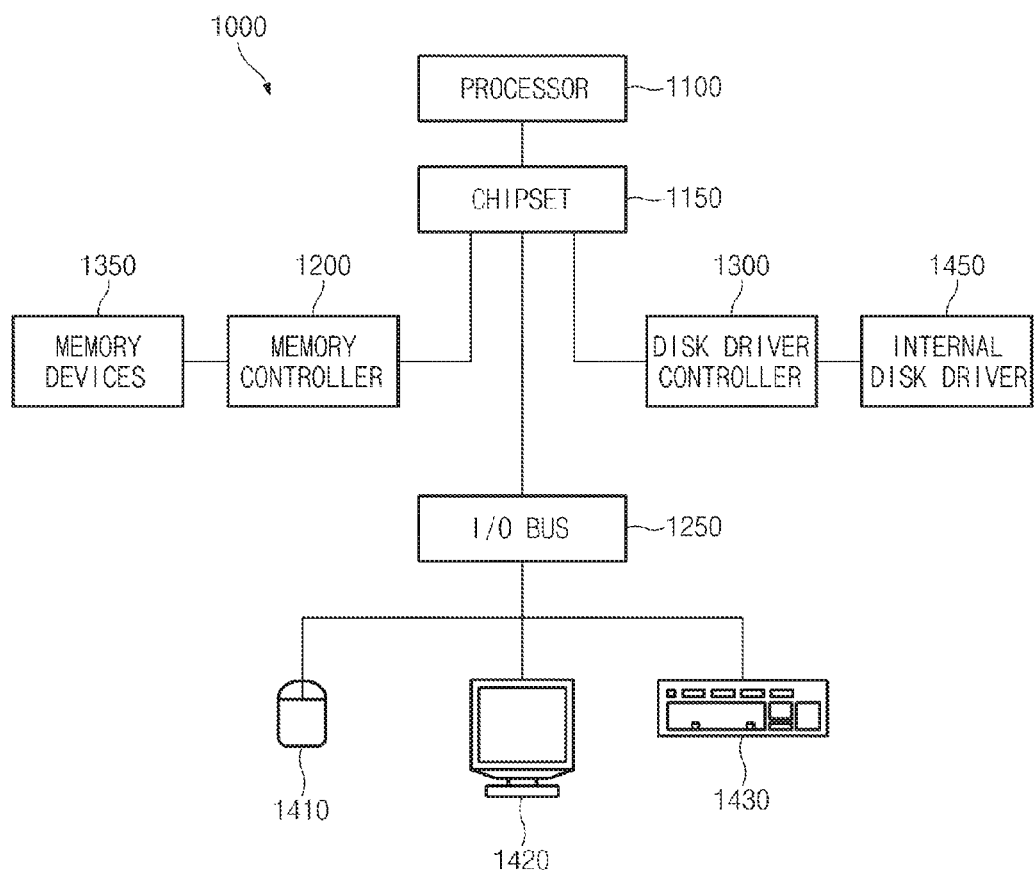
FIG. 6 illustrates a block diagram of an example of a representation of a system employing a self-refresh control device with the various embodiments discussed above with relation to FIGS. 1-5.

The self-refresh control devices discussed above (see FIGS. 1-5) are particular useful in the design of memory devices, processors, and computer systems. For example, referring to FIG. 6, a block diagram of a system employing a self-refresh control device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one self-refresh control device as discussed above with reference to FIGS. 1-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one self-refresh control device as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a system 1000 employing a self-refresh control device as discussed above with relation to FIGS. 1-5. In alternate embodiments, such as, for example but not limited to, cellular phones or digital cameras, the components may differ from the embodiments illustrated in FIG. 6.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A self-refresh control device comprising:
   an enable signal generation circuit configured to latch a clock enable signal for a predetermined time to output an oscillation enable signal;
   an end signal generation circuit configured to select any one of the oscillation enable signal and a self-refresh command signal to output the selected signal as an oscillation end signal; and
   a refresh signal output circuit configured to generate a self-refresh signal in response to the oscillation end signal, and output a refresh signal by combining the oscillation end signal and the self-refresh signal.

2. The self-refresh control device according to claim 1, wherein the enable signal generation circuit is configured to deactivate the oscillation enable signal when the self-refresh signal is activated.

3. The self-refresh control device according to claim 1, wherein the enable signal generation circuit includes:
   a pulse generator configured to generate a pulse signal by delaying the clock enable signal; and
   a latch circuit configured to output the oscillation enable signal by latching the pulse signal.

4. The self-refresh control device according to claim 3, wherein the pulse generator includes:
   a plurality of inverters configured to delay the clock enable signal; and
   a first NAND gate configured to perform a NAND operation between the clock enable signal and output signal of the plurality of inverters.

5. The self-refresh control device according to claim 3, wherein the latch circuit is configured to deactivate the oscillation enable signal when the self-refresh signal is activated.

6. The self-refresh control device according to claim 3, wherein the latch circuit includes a Set-Reset (SR) latch circuit, wherein the SR latch circuit receives an output signal of the pulse generator as a set signal, and receives the self-refresh signal as a reset signal.

7. The self-refresh control device according to claim 1, wherein the end signal generation circuit is configured to activate the oscillation end signal when at least one of the oscillation enable signal and a delay signal of the self-refresh command signal is activated.

8. The self-refresh control device according to claim 1, wherein the end signal generation circuit includes:

a first delay circuit configured to delay the self-refresh command signal for a predetermined time; and a first combination circuit configured to perform an OR operation between an output signal of the first delay circuit and the oscillation enable signal to output the oscillation end signal.

9. The self-refresh control device according to claim 8, wherein the first combination circuit includes:

a logic gate configured to perform a NOR operation between an output signal of the first delay circuit and the oscillation enable signal; and a first inverter configured to output the oscillation end signal by inverting an output signal of the logic gate.

10. The self-refresh control device according to claim 1, wherein the refresh signal output circuit includes:

an oscillator configured to generate the self-refresh signal in response to the oscillation end signal;

a second delay circuit configured to output a delay signal by delaying the self-refresh signal; and a second combination circuit configured to output the refresh signal by combining the delay signal and the oscillation end signal.

11. The self-refresh control device according to claim 10, wherein the second combination circuit is configured to output the refresh signal having a predetermined pulse width by performing an AND operation between the delay signal and the oscillation end signal.

12. The self-refresh control device according to claim 10, wherein the oscillator maintains an operation state during an enable section of the oscillation end signal within a predetermined self-refresh mode section, such that the first self-refresh command signal is generated as a single pulse shape.

13. The self-refresh control device according to claim 10, wherein the oscillator is configured to generate the self-refresh signal in response to a test signal that remains high in level during a specific period in a test mode.

14. The self-refresh control device according to claim 13, wherein:

the test signal having a first period is input at a high temperature; and the test signal having a second period is input at a low temperature, wherein the first period is shorter than the second period.

15. The self-refresh control device according to claim 1, wherein the self-refresh signal output circuit is configured to generate the refresh signal only once even when entering a plurality of self-refresh modes within a predetermined self-refresh mode section.

16. The self-refresh control device according to claim 1, wherein the refresh signal is generated only once within a predetermined time section in which the oscillation enable signal and the oscillation end signal are activated to a high level.

17. A self-refresh control device comprising:

a refresh signal output circuit configured to generate self-refresh signals with an oscillator and provide a refresh signal, wherein the self-refresh control device begins a self-refresh mode in response to a clock enable signal and a self-refresh signal within a self-refresh entry period, and prevents performance of a new self-refresh operation by delaying an additional self-refresh signal until after the self-refresh entry period has ended.

18. The self-refresh control device according to claim 17, further comprising:

an enable signal generation circuit configured to latch the clock enable signal for a predetermined time to output an oscillation enable signal; and an end signal generation circuit configured to select any one of the oscillation enable signal and a self-refresh command signal to output the selected signal as an oscillation end signal, wherein the refresh signal output circuit generates the self-refresh signal in response to the oscillation end signal, and outputs the refresh signal by combining the oscillation end signal and the self-refresh signal.

19. A self-refresh control device comprising:

a refresh signal output circuit configured to generate self-refresh signals with an oscillator and provide a refresh signal, wherein the self-refresh control device begins a self-refresh mode in response to a clock enable signal and a self-refresh signal within a self-refresh entry period, and only activates the refresh signal once during the self-refresh entry period, wherein the refresh signal is activated only once during the self-refresh entry period by delaying an additional self-refresh signal until after the self-refresh entry period has ended.

20. The self-refresh control device according to claim 19, further comprising:

an enable signal generation circuit configured to latch the clock enable signal for a predetermined time to output an oscillation enable signal; and an end signal generation circuit configured to select any one of the oscillation enable signal and a self-refresh command signal to output the selected signal as an oscillation end signal, wherein the refresh signal output circuit generates the self-refresh signal in response to the oscillation end signal, and outputs the refresh signal by combining the oscillation end signal and the self-refresh signal.

\* \* \* \* \*